(12) United States Patent
Ashimine et al.

(10) Patent No.: US 11,239,226 B2
(45) Date of Patent: Feb. 1, 2022

(54) SEMICONDUCTOR APPARATUS

(71) Applicant: Murata Manufacturing Co., Ltd., Nagaokakyo (JP)

(72) Inventors: Tomoyuki Ashimine, Nagaokakyo (JP); Hiroshi Nakagawa, Nagaokakyo (JP); Yasuhiro Murase, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/883,497

(22) Filed: May 26, 2020

(65) Prior Publication Data

US 2020/0286880 A1   Sep. 10, 2020

Related U.S. Application Data

(63) Continuation of application No. PCT/JP2018/047714, filed on Dec. 26, 2018.

(30) Foreign Application Priority Data

Dec. 28, 2017   (JP) .............................. JP2017-254595

(51) Int. Cl.
   *H01L 29/73*   (2006.01)
   *H01L 27/01*   (2006.01)
   (Continued)

(52) U.S. Cl.
   CPC ........ *H01L 27/013* (2013.01); *H01L 27/0652* (2013.01); *H01L 28/20* (2013.01);
   (Continued)

(58) Field of Classification Search
   None
   See application file for complete search history.

(56) References Cited

U.S. PATENT DOCUMENTS 6,472,692 B1 * 10/2002 Satoh .................. H01L 29/1016
                                                              257/131
2007/0274014 A1   11/2007 Berberich
(Continued)

FOREIGN PATENT DOCUMENTS

JP            S628550 A     1/1987
JP            S63213956 A   9/1988
(Continued)

OTHER PUBLICATIONS

International Search Report issued for PCT/JP2018/047714, dated Feb. 5, 2019.

(Continued)

*Primary Examiner* — Benjamin P Sandvik
(74) *Attorney, Agent, or Firm* — Arent Fox LLP

(57) ABSTRACT

A semiconductor apparatus that includes a semiconductor substrate having a first main surface and a second main surface, a first electrode opposing the first main surface of the semiconductor substrate, a dielectric layer between the semiconductor substrate and the first electrode, a second electrode opposing the second main surface of the semiconductor substrate, and a resistance control layer between the semiconductor substrate and the second electrode. The resistance control layer includes a first region having a first electrical resistivity and electrically connecting the semiconductor substrate and the second electrode, and a second region having a second electrical resistivity higher than the first electrical resistivity of the first region and adjacent to the first region.

16 Claims, 8 Drawing Sheets

(51) Int. Cl.
*H01L 49/02* (2006.01)
*H02M 3/158* (2006.01)
*H02M 7/5387* (2007.01)
*H01L 27/06* (2006.01)

(52) U.S. Cl.
CPC ............ *H01L 28/92* (2013.01); *H02M 3/158* (2013.01); *H02M 7/5387* (2013.01)

(56) References Cited

U.S. PATENT DOCUMENTS

| | | | | |
|---|---|---|---|---|
| 2010/0117725 | A1* | 5/2010 | Mauder | H01L 29/861 327/587 |
| 2017/0229572 | A1* | 8/2017 | Nagase | H01L 29/0634 |
| 2018/0096931 | A1* | 4/2018 | Huang | H01L 24/89 |

FOREIGN PATENT DOCUMENTS

| | | |
|---|---|---|
| JP | H11195751 A | 7/1999 |
| JP | 2013016730 A | 1/2013 |
| JP | 5476747 B2 | 4/2014 |

OTHER PUBLICATIONS

Written Opinion of the International Searching Authority issued for PCT/JP2018/047714, dated Feb. 5, 2019.

\* cited by examiner

SEMICONDUCTOR APPARATUS

CROSS REFERENCE TO RELATED APPLICATIONS

The present application is a continuation of International application No. PCT/JP2018/047714, filed Dec. 26, 2018, which claims priority to Japanese Patent Application No. 2017-254595, filed Dec. 28, 2017, the entire contents of each of which are incorporated herein by reference.

FIELD OF THE INVENTION

The present invention relates to a semiconductor apparatus including a capacitor and a resistor.

BACKGROUND OF THE INVENTION

A semiconductor apparatus having a capacitor and a resistor includes, for example, a semiconductor substrate doped with impurities, a dielectric layer on a first main surface of the semiconductor substrate, and a conductive first electrode on the dielectric layer, and a conductive second electrode on a second main surface of the semiconductor substrate. At this time, because the electrical resistance of the semiconductor substrate is higher than that of the first electrode and the second electrode, the semiconductor substrate functions as a resistor and the dielectric layer functions as a capacitor that forms an electrostatic capacitance. The electrical resistance of the resistor is determined by the dimensions of the semiconductor apparatus, that is, the area and thickness of the semiconductor substrate. For this reason, it is difficult to design a semiconductor apparatus as a semiconductor circuit having appropriate electrostatic capacitance and electrical resistance.

For example, Patent Document 1 discloses a semiconductor apparatus in which semiconductor substrate includes a first resistance region connected directly below a capacitor, a peripheral resistance region arranged in parallel with the first resistance region, and a resistance isolation region having a resistance value equal to or greater than the resistance value of the first resistance region, the resistance isolation region being between the first resistance region and the peripheral resistance region. The resistance isolation region is ion-implanted into the semiconductor substrate to deteriorate the crystallinity and increase the resistance. The semiconductor apparatus described in Patent Document 1 can change the electrical resistance of the resistor by controlling the resistance value of the resistance isolation region and controlling the volume ratio between the first resistance region and the resistance isolation region. That is, the degree of freedom in circuit design of the semiconductor apparatus can be increased.

Patent Document 1: Japanese Patent No. 5476747

SUMMARY OF THE INVENTION

However, in the semiconductor apparatus described in Patent Document 1, when implanting ions into the resistance isolation region, high implantation energy is required to uniformly increase the resistance of the semiconductor substrate in the thickness direction, and there occurs a problem that control of the resistance value is difficult.

The present invention has been made in view of such circumstances, and it is an object of the present invention to provide a semiconductor apparatus capable of increasing the degree of freedom in circuit design.

A semiconductor apparatus according to an aspect of the present invention includes a semiconductor substrate having a first main surface and a second main surface, a first electrode opposing the first main surface of the semiconductor substrate, a dielectric layer between the semiconductor substrate and the first electrode, a second electrode opposing the second main surface of the semiconductor substrate, and a resistance control layer between the semiconductor substrate and the second electrode, in which the resistance control layer includes a first region that has a first electrical resistivity and that electrically connects the semiconductor substrate and the second electrode, and a second region that has a second electrical resistivity higher than the first electrical resistivity of the first region and is adjacent to the first region.

According to the present invention, it is possible to provide a semiconductor apparatus capable of increasing the degree of freedom in circuit design.

DETAILED DESCRIPTION OF THE INVENTION

Figure 1:
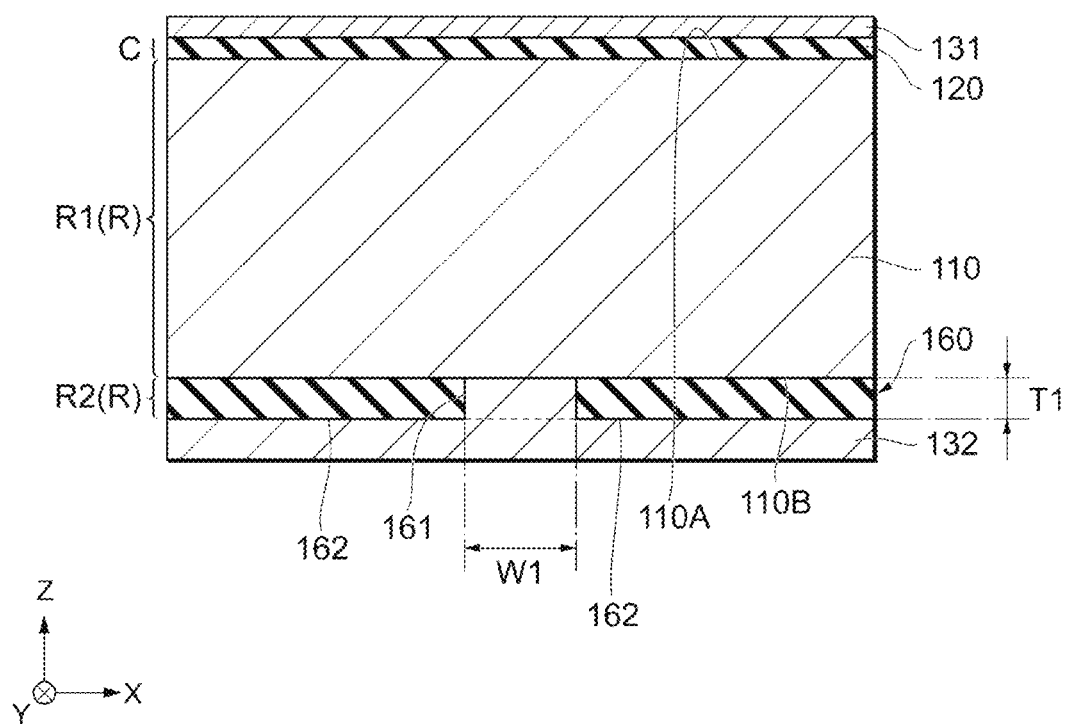
FIG. 1 is a cross-sectional view schematically illustrating a configuration of a semiconductor apparatus according to a first embodiment.

Hereinafter, embodiments of the present invention will be described with reference to the drawings. However, in each of the second and subsequent embodiments, constituent elements that are the same as or similar to those of the first embodiment are denoted by the same or similar reference numerals as those of the first embodiment, and detailed descriptions thereof will be omitted as appropriate. Further, regarding the effects obtained in each of the second and subsequent embodiments, the description of the same effects as those in the first embodiment will be appropriately omitted. The drawings of each embodiment are exemplifications, and the dimensions and shapes of each part are schematic, and the technical scope of the present invention should not be limited to the embodiments.

In each drawing, in order to clarify the relationship between the drawings and to help understand the positional relationship of each member, a rectangular coordinate system (XYZ coordinate system) including an X axis, a Y axis, and a Z axis may be added for the sake of convenience. In this case, for example, a direction parallel to the X axis is referred to as an "X-axis direction". The same applies to directions parallel to other axes. In the following description, a positive Z-axis direction side is referred to as upper (above). Note that the X-axis direction is not limited to the positive direction of the arrow, but also includes the negative direction opposite to the arrow. Further, a plane parallel to the plane specified by the X axis and the Y axis is referred to as an "XY plane", and the same applies to a plane parallel to a plane specified by other axes hereinafter.

First Embodiment

Figure 2:
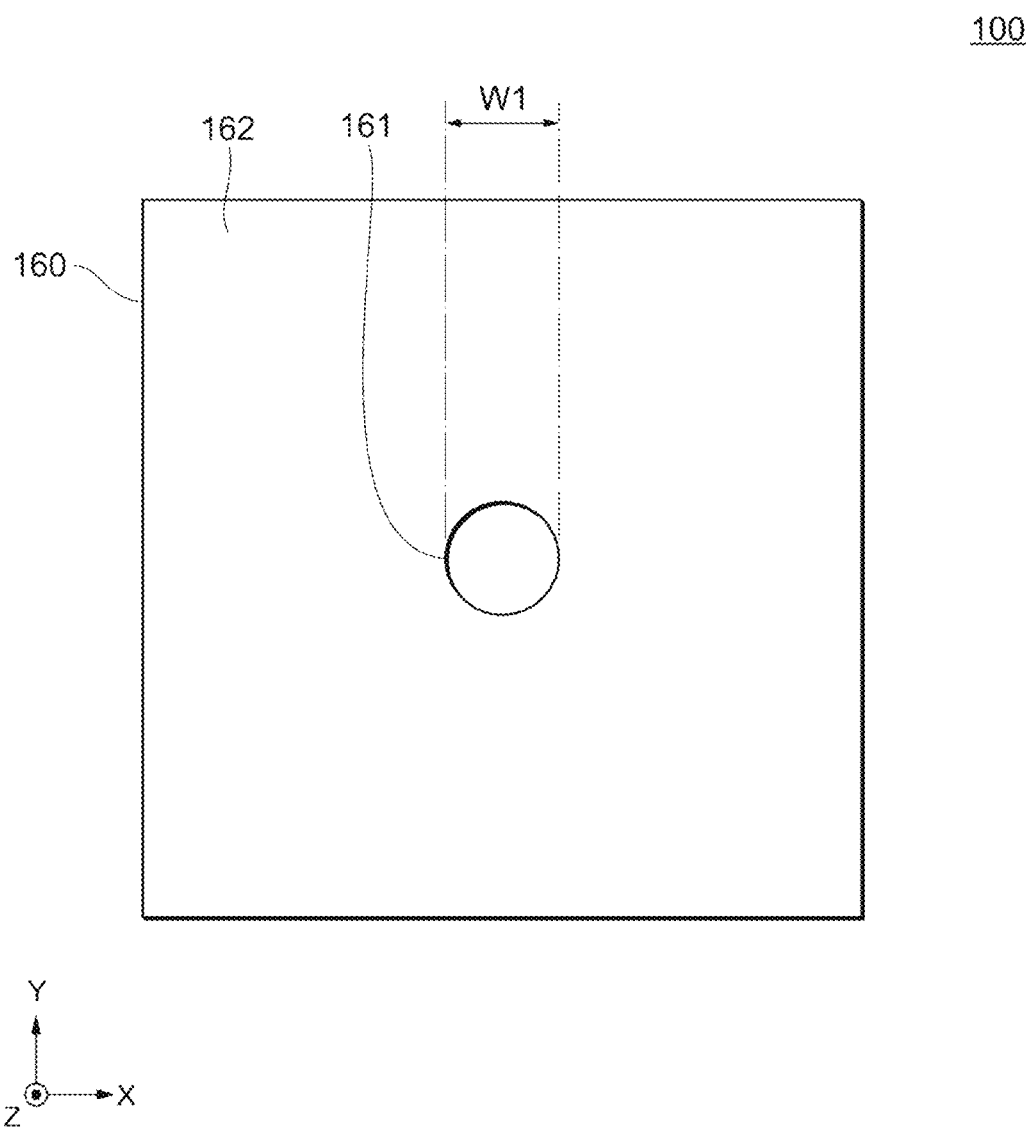
FIG. 2 is a plan view schematically illustrating a configuration of the semiconductor apparatus according to the first embodiment.

First, the configuration of a semiconductor apparatus 100 according to a first embodiment of the present invention will be described with reference to FIGS. 1 and 2. FIG. 1 is a cross-sectional view schematically illustrating a configuration of the semiconductor apparatus according to the first embodiment. FIG. 2 is a plan view schematically illustrating a configuration of the semiconductor apparatus according to the first embodiment. Note that FIG. 2 illustrates the semiconductor apparatus 100 when a resistance control layer 160 is viewed in a plan view with the illustration of a second electrode 132 omitted.

The semiconductor apparatus 100 is a semiconductor circuit in which a capacitor C forming an electrostatic capacitance and a resistor R functioning as an electrical resistance are integrally formed. That is, the semiconductor apparatus 100 corresponds to a CR circuit. The semiconductor apparatus 100 includes a semiconductor substrate 110, a dielectric layer 120, a first electrode 131, the second electrode 132, and a resistance control layer 160. The semiconductor substrate 110 functions as a resistor R1, the dielectric layer 120 functions as the capacitor C, and the resistance control layer 160 functions as a resistor R2. The resistor R includes the resistor R1 and the resistor R2. The semiconductor apparatus 100 may be, for example, a discrete part independent of other elements, or may be a part of an IC package integrated with other elements on a common semiconductor substrate 110.

The semiconductor substrate 110 includes a first main surface 110A and a second main surface 110B parallel to the XY plane. The first main surface 110A is a main surface on the positive Z-axis direction side, and the second main surface 110B is a main surface on the negative Z-axis direction side. When viewed from the normal direction of the first main surface 110A, the semiconductor substrate 110 has a rectangular shape. However, the shape of the semiconductor substrate 110 is not limited to the above, but may be a polygon, a circle, an ellipse, or a combination thereof.

The semiconductor substrate 110 is, for example, a p-type or n-type silicon substrate having an electrical resistivity of $10^{-4}$ Ω·cm to $10^{-2}$ Ω·cm. In other words, the semiconductor substrate 110 a p-type or n-type silicon substrate having an impurity concentration of $10^{19}$ cm$^{-3}$ to $10^{21}$ cm$^{-3}$.

When the semiconductor substrate 110 is a silicon substrate, it can be manufactured at a lower cost than a case where it is a different semiconductor material. Further, when the semiconductor substrate 110 is a low-resistance silicon substrate having an electrical resistivity of $10^{-2}$ Ω·cm or less, the temperature dependence of mobility can be reduced. When the resistor R is mainly configured by the semiconductor substrate 110 as in the conventional configuration, it is necessary to provide the semiconductor substrate 110 by a silicon substrate having an electrical resistivity of 1 Ω·cm or more. However, in a silicon substrate having an electrical resistivity of 1 Ω·cm or more, the mobility greatly changes with a temperature change. As a specific example, in an n-type silicon substrate having an impurity concentration of $10^{16}$ cm$^{-3}$, the mobility at 200° C. becomes about ⅕ of the mobility at −55° C. If the impurity concentration of the silicon substrate is $10^{19}$ cm$^{-3}$ or more, that is, if the electrical resistivity is $10^{-2}$ Ω·cm or less, it is possible to suppress an increase in electrical resistivity due to a decrease in mobility, and it is possible to suppress a temperature change in characteristics of the semiconductor apparatus 100 as a semiconductor circuit. Note that when the electrical resistivity is equal to or higher than $10^{-4}$ Ω·cm, the semiconductor substrate 110 can function as a semiconductor instead of a conductor. That is, it can function as the resistor R1.

The semiconductor substrate 110 is not limited to a silicon substrate, but may be a semiconductor material such as germanium (Ge), gallium arsenide (GaAs), or silicon carbide (SiC).

The dielectric layer 120 is provided between the first main surface 110A of the semiconductor substrate 110 and the first electrode 131. The dielectric layer 120 is a silicon compound such as a silicon oxide ($SiO_2$), a silicon nitride ($Si_3N_4$) film, a silicon oxynitride (SiOxNy) film, or the like. In a case where the semiconductor substrate 110 is a silicon substrate, the dielectric layer 120 made of silicon oxide can be easily provided by thermal oxidation of the silicon substrate, and generation of a leak current due to a defect can be suppressed. Since the dielectric layer 120 made of silicon nitride or silicon oxynitride can have a higher dielectric constant than silicon oxide, the capacitance of the capacitor C can be increased. The dielectric layer 120 may be a multilayer structure. For example, when the semiconductor substrate 110 is a silicon substrate, the dielectric layer 120 is provided with silicon oxide on the first main surface 110A of the semiconductor substrate 110 by thermal oxidation, and silicon nitride may be provided by being deposited on silicon oxide by PVD (Physical Vapor Deposition) or CVD (Chemical Vapor Deposition). According to this, the dielectric layer 120 can increase the capacitance of the capacitor C while suppressing the leak current. Note that the chemical formula of the silicon compound indicates an example of the composition, and does not limit the composition of the silicon compound. Further, elements other than silicon (Si), oxygen (O), and nitrogen (N) may be included. Hereinafter, the same applies to other substances.

At least a part of the dielectric layer 120 may be an oxide such as aluminum oxide ($Al_2O_3$), hafnium oxide ($HfO_2$), tantalum oxide ($Ta_2O_5$), barium titanate ($BaTiO_3$), barium strontium titanate (($BaSr)TiO_3$), strontium titanate ($SrTiO_3$), and calcium zirconate ($CaZrO_3$). In order to increase the capacitance of the capacitor C, the dielectric layer 120 desirably is a material having a high dielectric constant, and for example, it is desirable to use a perovskite oxide having a dielectric constant higher than that of silicon oxide.

The first electrode 131 is provided so as to oppose the first main surface 110A of the semiconductor substrate 110. The second electrode 132 is provided so as to oppose the second main surface 110B of the semiconductor substrate 110. The first electrode 131 faces the semiconductor substrate 110 across the dielectric layer 120, and the second electrode 132 faces the semiconductor substrate 110 across the resistance control layer 160. The first electrode 131 may cover the entire surface of the dielectric layer 120, or may cover only the dielectric layer 120 in a region intended to function as the capacitor C.

The first electrode 131 and the second electrode 132 are formed of, for example, silicon with reduced resistance. The first electrode 131 and the second electrode 132 may be formed of metal such as Cu (copper), Ag (silver), Au (gold), Al (aluminum), Mo (molybdenum), W (tungsten), Pt (platinum), Ti (titanium), Ni (nickel), Cr (chromium), or an alloy thereof.

Further, the first electrode 131 and the second electrode 132 may be any oxide having conductivity such as $RuO_2$, $SrRuO_3$, $LaNiO_3$, or may be an organic material such as a conductive resin. The first electrode 131 and the second electrode 132 may be electrodes having different configurations. Further, the first electrode 131 and the second electrode 132 may be a multilayer structure. The electrical resistivity of the first electrode 131 and the second electrode 132 is equal to or smaller than the electrical resistivity of the semiconductor substrate 110. According to this, in the semiconductor apparatus 100, the influence of the first electrode 131 and the second electrode 132 on the resistance value of the resistor R can be reduced.

The resistance control layer 160 is provided between the semiconductor substrate 110 and the second electrode 132. The resistance control layer 160 includes a low resistance region 161 and a high resistance region 162. The low resistance region 161 corresponds to a first region of the resistance control layer 160, and the high resistance region 162 corresponds to a second region of the resistance control layer 160. The low resistance region 161 is provided so as to electrically connect the semiconductor substrate 110 and the second electrode 132. The high resistance region 162 is aligned with the low resistance region 161 in a direction parallel to the second main surface 110B of the semiconductor substrate 110. The electrical resistivity of the high resistance region 162 is larger than the electrical resistivity of the low resistance region 161. For example, the low resistance region 161 is a conductor, and the high resistance region 162 is an insulator.

In the formation of the resistance control layer 160, for example, an insulator layer is provided on the second main surface 110B of the semiconductor substrate 110 by PVD or CVD, a part of the insulator layer is etched, and a conductor is formed in the space formed by the etching to form the low resistance region 161. Then, the insulator layer which remains without being etched is used as the high resistance region 162. In such semiconductor apparatus 100, the thickness of the resistance control layer 160 can be increased, and the resistance value of the resistor R2 can be easily changed. In the case where the semiconductor substrate 110 is silicon, silicon oxide provided by thermal oxidation may be used as the insulator layer. According to this, the manufacturing process of the semiconductor apparatus 100 can be simplified. That is, the manufacturing cost of the semiconductor apparatus 100 can be reduced.

Note that the low resistance region 161 and the high resistance region 162 may be a semiconductor. In the formation of such resistance control layer 160, for example, the high resistance region 162 is provided first, and then the low resistance region 161 is provided. Specifically, first, a high-resistance semiconductor layer is provided on the second main surface 110B of the semiconductor substrate 110 by PVD, CVD, or the like. Next, a part of the high-resistance semiconductor layer is reduced in resistance by doping. This low resistance portion is referred to as the low resistance region 161, and the high-resistance semiconductor layer is referred to as the high resistance region 162. Conversely, in forming the resistance control layer 160, the low resistance region 161 may be provided first, and then the high resistance region 162 may be provided. Specifically, first, a low-resistance semiconductor layer is provided on the second main surface 110B of the semiconductor substrate 110 by PVD, CVD, or the like. Next, the crystallinity of a part of the low-resistance semiconductor layer is reduced to increase the resistance. This high resistance portion may be referred to as the high resistance region 162, and the low-resistance semiconductor layer may be referred to as the low resistance region 161. As described above, when the resistance control layer 160 is provided by reducing or increasing the resistance of a part of the semiconductor layer, the resistance control layer 160 can be provided such that the low resistance region 161 and the high resistance region 162 have the same thickness. Accordingly, a change in dimension of the low resistance region 161 can be suppressed, and thus a change in resistance value of the resistor R2 can be suppressed. Further, occurrence of defects such as separation between the low resistance region 161 and the high resistance region 162 can be suppressed.

Between the semiconductor substrate 110 and the second electrode 132, electricity mainly flows through the low resistance region 161. That is, between the semiconductor substrate 110 and the second electrode 132, the low resistance region 161 of the resistance control layer 160 functions as a conduction bottleneck. Therefore, the resistance value of the resistor R2 changes depending on the physical properties and dimensions of the low resistance region 161. Specifically, the resistance value of the resistor R2 can be designed by the electrical resistivity of the low resistance region 161, a thickness T1 of the low resistance region 161 along the Z-axis direction, a width W1 of the low resistance region 161 along the X-axis direction, and the like.

The width W1 is larger than the thickness T1. According to this, it is possible to suppress the defect of the resistance control layer 160 and the change in resistance value of the resistor R2. When a conductor or semiconductor is provided in the space formed by etching to form the low resistance region 161, the width W1 is larger than the thickness T1, thereby suppressing the occurrence of defects such as gaps due to poor formation of the low resistance region 161. Further, since the width W1 is larger than the thickness T1, the cross-sectional shape of the low resistance region 161 can be suppressed from being tapered or reverse-tapered. Since the change in shape of the low resistance region 161 can be suppressed, the change in resistance value of the resistor R2 between the individual semiconductor apparatuses 100 can be suppressed.

In the case where the resistance of a part of the semiconductor layer is reduced to form the low resistance region 161, when the width W1 is larger than the thickness T1, the impurity concentration of the low resistance region 161 along the Z-axis direction can be easily made uniform. That is, it is possible to suppress a change in resistance value of the resistor R2 between the individual semiconductor apparatuses 100. Further, when the width W1 is larger than the thickness T1, even if the irradiation energy of impurities during doping is reduced, the low resistance region 161 can be uniformly doped, thereby suppressing the occurrence of defects in the low resistance region 161.

Note that the resistance value of the resistor R2 can be designed by the cross-sectional area of the low resistance region 161 parallel to the first main surface 110A of the semiconductor substrate 110. Therefore, the dimensions for designing the resistance value of the resistor R2 are not limited to the thickness T1 of the low resistance region 161 along the Z-axis direction and the width W1 along the X-axis direction. The resistance value of the resistor R2 may be designed by the shape of the low resistance region 161 when viewed in plan on the XY plane or the width along the Y-axis direction.

In the configuration example illustrated in FIG. 2, the low resistance region 161 of resistance control layer 160 is provided in a circular shape when the second main surface 110B of semiconductor substrate 110 is viewed in plan. The diameter of the low resistance region 161 is the width W1. By providing the low resistance region 161 in a circular shape, it is possible to suppress defects such as dielectric breakdown due to electric field concentration that may occur at a corner when the low resistance region 161 has the corner, damage due to a stress concentration that may occur at the corner, and the like. Note that, when the second main surface 110B of the semiconductor substrate 110 is viewed in plan, the shape of the low resistance region 161 is not limited to the above, but may be an ellipse, a rectangle, a polygon, or a combination thereof.

The low resistance region 161 of the resistance control layer 160 is formed integrally with the second electrode 132 using the same material as the second electrode 132. At this time, the electrical resistivity of the low resistance region 161 is equal to the electrical resistivity of the second electrode 132. According to this, the low resistance region 161 and the second electrode 132 can be provided simultaneously in the same process. That is, the manufacturing process of the semiconductor apparatus 100 can be simplified, and the manufacturing cost can be reduced. Further, since the types of interfaces at which different materials contact each other between the resistance control layer 160 and the second electrode 132 can be reduced, occurrence of defects such as separation between the resistance control layer 160 and the second electrode 132 can be reduced.

As described above, in the semiconductor apparatus 100, since the resistance value of the resistor R2 can be changed by the resistance control layer 160, it is possible to preferably change the combination of the element values of the capacitor C and the resistor R. That is, the degree of freedom in design of the semiconductor apparatus 100 as a semiconductor circuit can be improved.

Note that the semiconductor apparatus 100 may include a resistance control layer on the first electrode 131, that is, between the first electrode 131 and a wiring portion, which is not illustrated. The wiring portion here is a portion for electrically connecting the semiconductor apparatus 100 to an external circuit, and is provided to face the semiconductor substrate 110 across the first electrode 131. Such a resistance control layer includes a low resistance region that electrically connects the first electrode 131 and the wiring portion, and a high resistance region having a higher electrical resistivity than the low resistance region. The resistance control layer provided on the first electrode 131 can have the same configuration as the resistance control layer 160. When a resistance control layer is also provided between the first electrode 131 and the wiring portion, the resistance value of the resistor R can be changed even with such a resistance control layer, so that the degree of freedom in design of the semiconductor apparatus 100 as a semiconductor circuit can be improved.

Next, application examples of the semiconductor apparatus 100 will be described with reference to FIG. 3.

Figure 3:
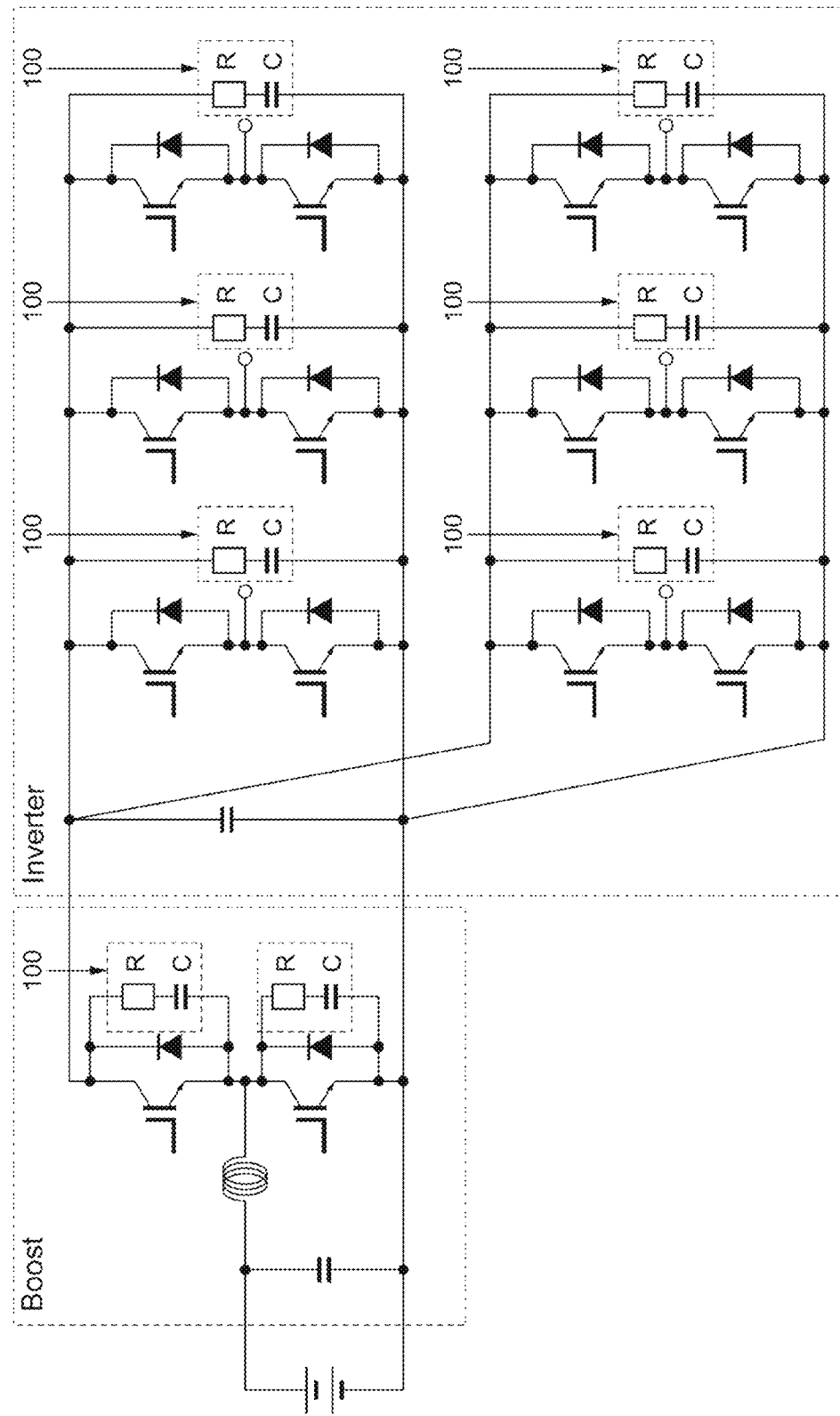
FIG. 3 is a circuit diagram schematically illustrating a mounting example of a semiconductor apparatus as a circuit according to the first embodiment.

FIG. 3 is a circuit diagram schematically illustrating a mounting example of the semiconductor apparatus as a circuit according to the first embodiment.

The semiconductor apparatus 100 is used for, for example, a boost circuit or an inverter circuit. The semiconductor apparatus 100 can function as a snubber circuit by being connected in parallel between the drain and source or between the collector and emitter of the transistor. In the semiconductor apparatus 100, even if the dimensions of the semiconductor apparatus 100 are changed, the resistance value of the resistor R can be changed in accordance with the electrostatic capacitance of the capacitor C. That is, even if the dimensions of the semiconductor apparatus 100 are limited, the semiconductor apparatus 100 can be designed as a semiconductor circuit having a suitable electrostatic capacitance and resistance value as a snubber circuit. Since the semiconductor apparatus 100 can have a sufficient resistance value as a snubber circuit, it can be used as a snubber circuit without electrically connecting a resistance element to the outside.

The application of the semiconductor apparatus 100 is not limited to the snubber circuit. For example, the semiconductor apparatus 100 may be used as a part of a filter circuit or a matching circuit.

Second Embodiment

Figure 4:
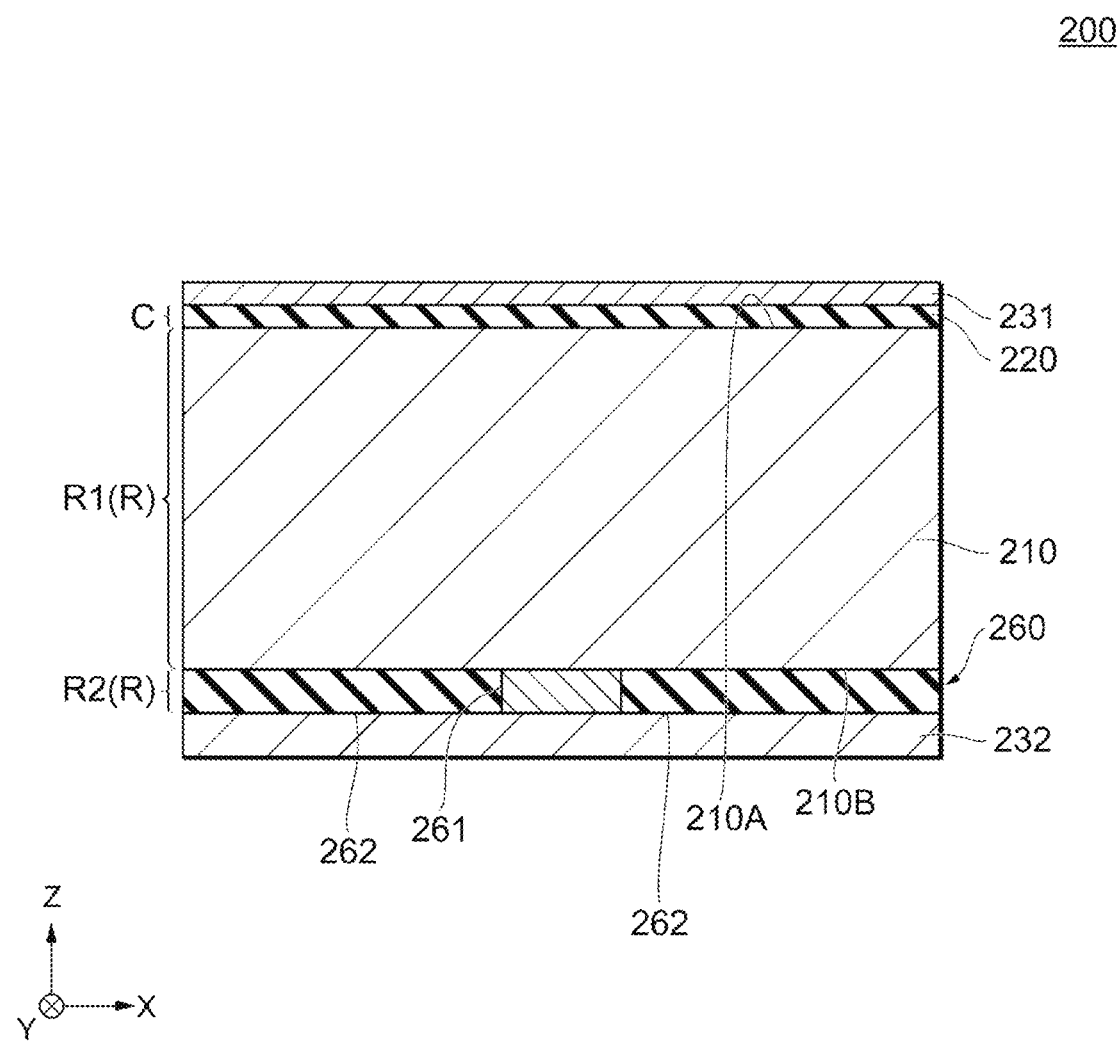
FIG. 4 is a cross-sectional view schematically illustrating a configuration of a semiconductor apparatus according to a second embodiment.

Next, the configuration of a semiconductor apparatus 200 according to the second embodiment will be described with reference to FIG. 4. FIG. 4 is a cross-sectional view schematically illustrating a configuration of the semiconductor apparatus according to the second embodiment.

Similar to the semiconductor apparatus 100 according to the first embodiment, the semiconductor apparatus 200 according to the second embodiment includes a semiconductor substrate 210, a dielectric layer 220, a first electrode 231, a second electrode 232, and a resistance control layer 260. The resistance control layer 260 includes a low resistance region 261 and a high resistance region 262.

The semiconductor apparatus 200 according to the second embodiment is different from the semiconductor apparatus 100 according to the first embodiment in that the low resistance region 261 of the resistance control layer 260 is a material different from that of the second electrode 232.

The electrical resistivity of the low resistance region 261 is higher than the electrical resistivity of the second electrode 232. According to this, the resistance value of the resistor R2 can be increased. That is, the degree of freedom in design of the semiconductor apparatus 200 as a semiconductor circuit can be improved. Further, the electrical resistivity of the low resistance region 261 is larger than the electrical resistivity of the semiconductor substrate 210. According to this, the resistance value of the resistor R2 can be increased. That is, the degree of freedom in design of the semiconductor apparatus 200 as a semiconductor circuit can be improved.

Third Embodiment

Figure 5:
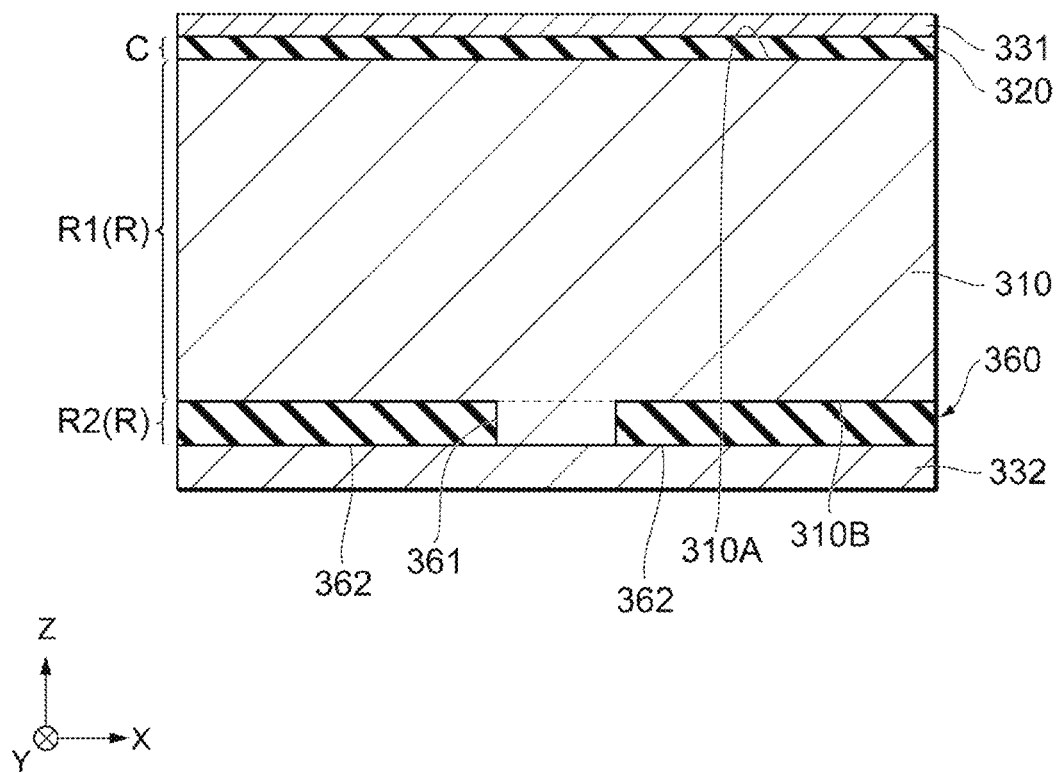
FIG. 5 is a cross-sectional view schematically illustrating a configuration of a semiconductor apparatus according to a third embodiment.

Next, the configuration of a semiconductor apparatus 300 according to the third embodiment will be described with reference to FIG. 5. FIG. 5 is a cross-sectional view schematically illustrating a configuration of the semiconductor apparatus according to the third embodiment.

Similar to the semiconductor apparatus 100 according to the first embodiment, the semiconductor apparatus 300 according to the third embodiment includes a semiconductor substrate 310, a dielectric layer 320, a first electrode 331, a second electrode 332, and a resistance control layer 360. The resistance control layer 360 includes a low resistance region 361 and a high resistance region 362.

The semiconductor apparatus 300 according to the third embodiment is different from the semiconductor apparatus 100 according to the first embodiment in that the low resistance region 361 of the resistance control layer 360 is provided integrally with the semiconductor substrate 310 by the same material as the semiconductor substrate 310. That is, the electrical resistivity of the low resistance region 361 is equal to the electrical resistivity of the semiconductor substrate 310.

According to this, the low resistance region 361 and the semiconductor substrate 310 can be provided simultaneously in the same process. Further, since the types of interfaces at which different materials contact each other between the resistance control layer 360 and the semiconductor substrate 310 can be reduced, occurrence of defects such as separation between the resistance control layer 360 and the semiconductor substrate 310 can be suppressed.

In the formation of the resistance control layer 360, for example, a part of the semiconductor substrate 310 is etched, and an insulator is provided in a space formed by the etching to form the high resistance region 362. According to this, the thickness of the low resistance region 361 can be increased, and the resistance value of the resistor R2 can be easily changed. In forming the resistance control layer 360, a part of the semiconductor substrate 310 may be made to have high resistance to form the high resistance region 362. Specifically, when the semiconductor substrate 310 is silicon, in forming the resistance control layer 360, a part of the semiconductor substrate 310 may be thermally oxidized to form the high resistance region 362. According to this, the manufacturing process of the semiconductor apparatus 300 can be simplified. That is, the manufacturing cost of the semiconductor apparatus 300 can be reduced.

Fourth Embodiment

Figure 6:
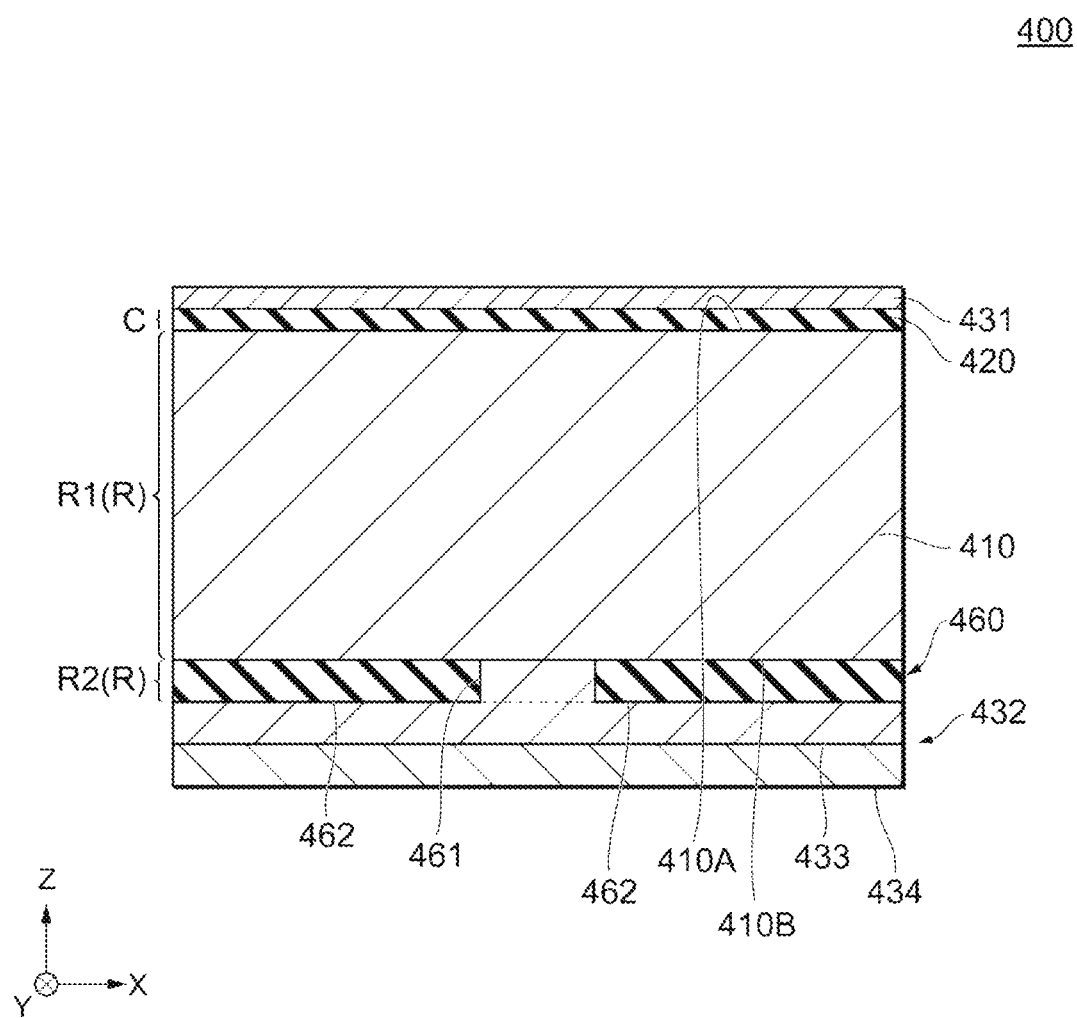
FIG. 6 is a cross-sectional view schematically illustrating a configuration of a semiconductor apparatus according to a fourth embodiment.

Next, the configuration of a semiconductor apparatus 400 according to the fourth embodiment will be described with reference to FIG. 6. FIG. 6 is a cross-sectional view schematically illustrating a configuration of the semiconductor apparatus according to the fourth embodiment.

Similar to the semiconductor apparatus 100 according to the first embodiment, the semiconductor apparatus 400 according to the fourth embodiment includes a semiconductor substrate 410, a dielectric layer 420, a first electrode 431, a second electrode 432, and a resistance control layer 460. The resistance control layer 460 includes a low resistance region 461 and a high resistance region 462.

The semiconductor apparatus 400 according to the fourth embodiment is different from the semiconductor apparatus 100 according to the first embodiment in that the second electrode 432 includes a first electrode layer 433 and a second electrode layer 434. The first electrode layer 433 contacts the high resistance region 462 of the resistance control layer 460 and is provided inside the low resistance region 461 of the resistance control layer 460. That is, the low resistance region 461 and the first electrode layer 433 are integrally provided by the same material. The second electrode layer 434 faces the resistance control layer 460 across the first electrode layer 433. Note that the low resistance region 461 may be at least partially occupied by the second electrode layer 434 as long as at least a part thereof is occupied by the first electrode layer 433. Specifically, in the low resistance region 461, the first electrode layer 433 is provided in a recessed shape along the surface of the high resistance region 462 and the semiconductor substrate 410, and the second electrode layer 434 may be formed inside of the low resistance region 461 along the recessed surface of the first electrode layer 433.

The electrical resistivity of the second electrode layer 434 is smaller than the electrical resistivity of the first electrode layer 433. According to this, even if the low resistance region 461 is formed of a low resistance material in order to increase the resistance value of the resistor R2, an increase in resistance value of the second electrode 432 can be suppressed. The second electrode layer 434 may be provided using a material having a higher hardness than the first electrode layer 433. According to this, when the second electrode 432 is electrically connected to an external circuit by soldering or wire bonding, damage to the second electrode 432 can be suppressed. Further, the second electrode layer 434 may be provided using a material having higher adhesiveness to solder or a bonding wire than the first electrode layer 433. According to this, poor electrical contact of the semiconductor apparatus 400 can be suppressed.

Fifth Embodiment

Figure 7:
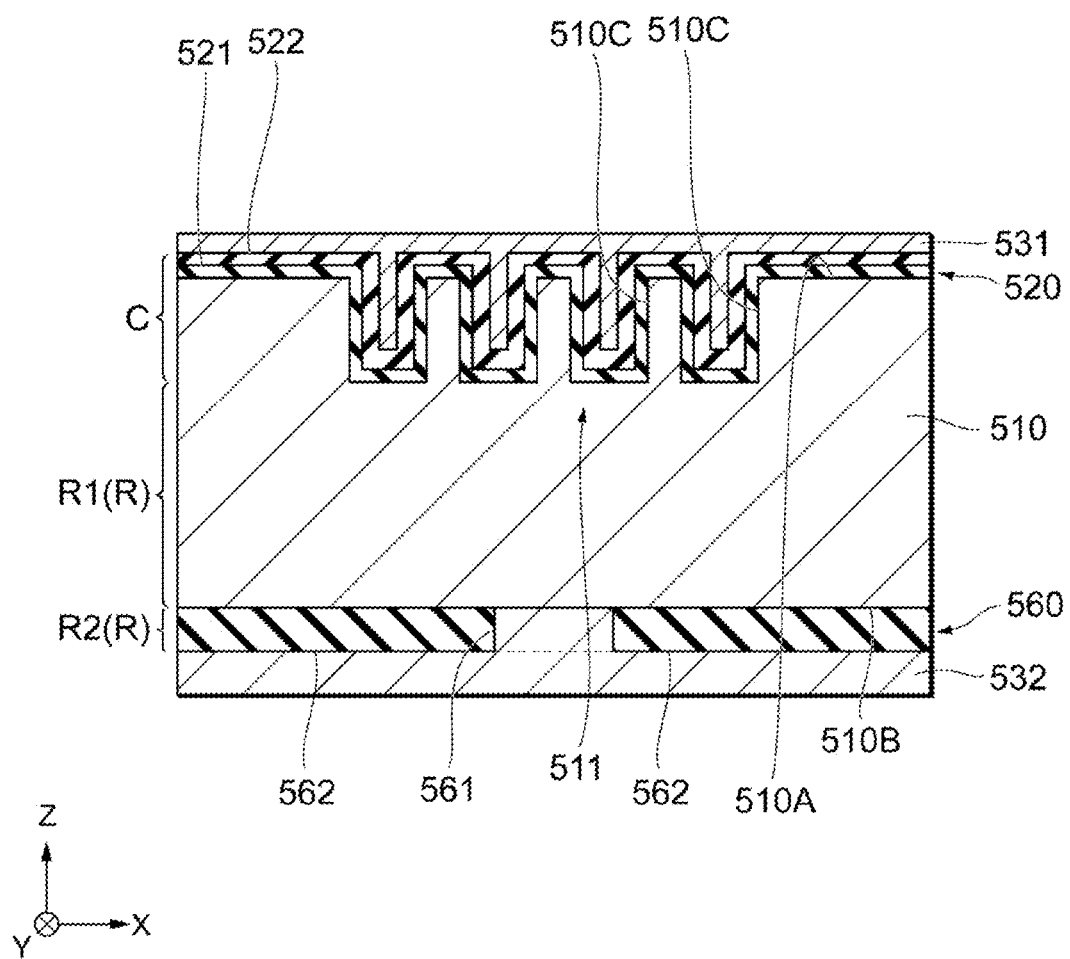
FIG. 7 is a cross-sectional view schematically illustrating a configuration of a semiconductor apparatus according to a fifth embodiment.
Figure 8:
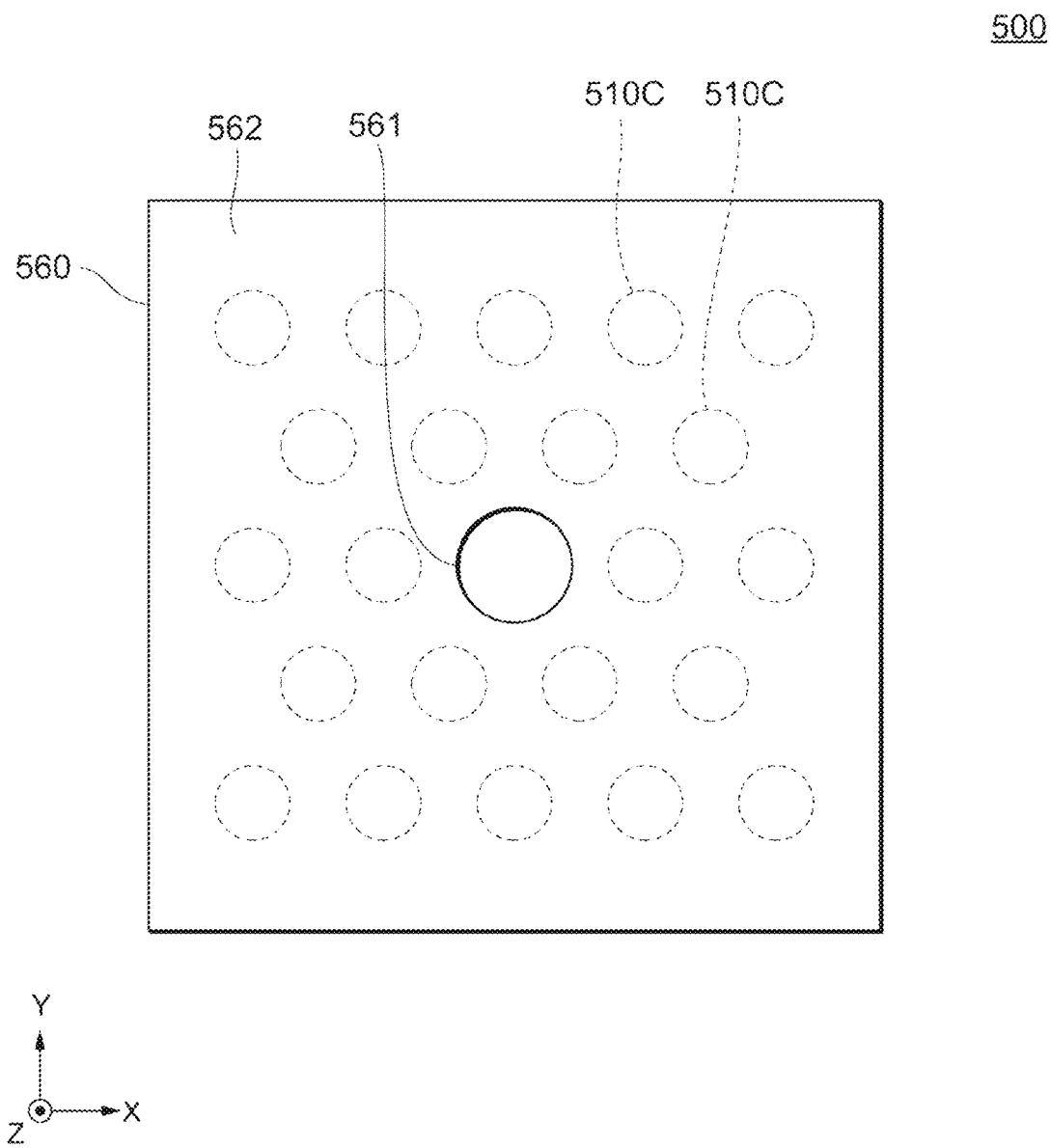
FIG. 8 is a plan view schematically illustrating the configuration of the semiconductor apparatus according to the fifth embodiment.

Next, the configuration of a semiconductor apparatus 500 according to the fifth embodiment will be described with reference to FIG. 7. FIG. 7 is a cross-sectional view schematically illustrating a configuration of the semiconductor apparatus according to the fifth embodiment. FIG. 8 is a plan view schematically illustrating the configuration of the semiconductor apparatus according to the fifth embodiment.

Similar to the semiconductor apparatus 100 according to the first embodiment, the semiconductor apparatus 500 according to the fifth embodiment includes a semiconductor substrate 510, a dielectric layer 520, a first electrode 531, a second electrode 532, and a resistance control layer 560. The resistance control layer 560 includes a low resistance region 561 and a high resistance region 562.

The semiconductor apparatus 500 according to the fifth embodiment is different from the semiconductor apparatus 100 according to the first embodiment in that a trench structure 511 including a plurality of trench portions 510C is formed on the first main surface 510A side of the semiconductor substrate 510.

The trench portions 510C are recessed portions that extend into the semiconductor substrate from the first main surface 510A in the Z-axis direction. The trench portions 510C are formed in a circular shape when the second main surface 510B is viewed in plan. The dielectric layer 520 and the first electrode 531 are formed along the trench structure 511, and extend inside the trench portions 510C.

Since the semiconductor apparatus 500 has the trench structure 511, the electrostatic capacitance of the capacitor C can be increased. The shape obtained when the XY plane of trench portion 510C is viewed in plan is not limited to a circular shape, but may be an elliptical shape, a rectangular shape, a polygonal shape, a lattice shape, or a combination thereof. Further, the shape of the trench portion 510C is not limited to a columnar shape, but may be a cone shape or a combination thereof. Further, the number of trench portions 510C is not particularly limited, and it is sufficient if at least one trench portion 510C is formed.

Note that the dielectric layer 520 may be a stack structure, and includes, for example, a first dielectric layer 521 and a second dielectric layer 522. In the semiconductor apparatus 500 having the trench structure 511, there is a possibility that a stress concentrates on a corner portion of the trench portion 510C and the dielectric layer 520 is easily damaged. When the dielectric layer 520 includes two or more different dielectric layers, the internal stress of the dielectric layer 520 can be reduced, and the occurrence of damage can be suppressed. Further, the first dielectric layer 521 is configured to be less likely to be damaged, and the second dielectric layer 522 is set to have a higher dielectric constant than the first dielectric layer 521, so that the occurrence of the leakage current can be suppressed and an increase in electrostatic capacitance can be increased in the capacitor C of the semiconductor apparatus 500.

As described above, according to an aspect of the present invention, there is provided the semiconductor apparatus 100 including the semiconductor substrate 110 having the first main surface 110A and the second main surface 110B, the first electrode 131 opposing the first main surface 110A of the semiconductor substrate 110, the dielectric layer 120 between the semiconductor substrate 110 and the first electrode 131, the second electrode 132 opposing the second main surface 110B of the semiconductor substrate 110, and the resistance control layer 160 between the semiconductor substrate 110 and the second electrode 132, in which the resistance control layer 160 includes the first region 161 for electrically connecting the semiconductor substrate 110 and the second electrode 132, and the second region 162 having a higher electrical resistivity than the first region 161 adjacent to the first region 161.

According to the above aspect, the semiconductor apparatus may be a semiconductor circuit in which the semiconductor substrate functions as a first resistor, the dielectric layer functions as a capacitor, and the resistance control layer functions as a second resistor. In the semiconductor apparatus, the resistance value of the second resistor can be changed depending on the electrical resistivity and the dimension of the first region of the resistance control layer. That is, in the semiconductor apparatus, the combination of the element values of the capacitor and the resistor can be suitably changed. In other words, the degree of freedom in design of the semiconductor apparatus as a semiconductor circuit can be improved.

The semiconductor substrate 110 may comprise silicon. According to this, a semiconductor substrate can be manufactured at a lower cost than in the case where the semiconductor substrate is a different semiconductor material.

The electrical resistivity of the semiconductor substrate 110 may be $10^{-4}$ Ω·cm to $10^{-2}$ Ω·cm. By setting the electrical resistivity of the semiconductor substrate to $10^{-2}$ Ω·cm or less, the temperature dependence of the mobility can be reduced. That is, a temperature change in characteristics of the semiconductor apparatus as a semiconductor circuit can be suppressed. Note that the semiconductor substrate can function as a semiconductor instead of a conductor by setting the electrical resistivity to $10^{-4}$ Ω·cm or more. That is, the semiconductor substrate can function as the first resistor.

The electrical resistivity of the first region 261 of the resistance control layer 260 may be equal to or greater than the electrical resistivity of the second electrode 232. When the first region and the second electrode have the same electrical resistivity, the first region and the second electrode can be provided simultaneously in the same process. That is, the manufacturing process of the semiconductor apparatus can be simplified to reduce the manufacturing cost. Further, since the types of interfaces at which different materials contact each other between the resistance control layer and the second electrode can be reduced, occurrence of defects such as separation between the resistance control layer and the second electrode can be reduced. When the electrical resistivity of the first region is higher than the electrical resistivity of the second electrode, the resistance value of the second resistor can be increased. That is, the degree of freedom in design of the semiconductor apparatus as a semiconductor circuit can be improved.

The electrical resistivity of the first region 261 of the resistance control layer 260 may be equal to or greater than the electrical resistivity of the semiconductor substrate 210. When the first region and the semiconductor substrate have the same electrical resistivity, the first region and the semiconductor substrate can be provided simultaneously in the same process. Further, since the types of interfaces at which different materials contact each other between the resistance control layer and the semiconductor substrate can be reduced, occurrence of defects such as separation between the resistance control layer and the semiconductor substrate can be suppressed. When the electrical resistivity of the first region is higher than the electrical resistivity of the semiconductor substrate, the resistance value of the second resistor can be increased. That is, the degree of freedom in design of the semiconductor apparatus as a semiconductor circuit can be improved.

The electrical resistivity of the semiconductor substrate 110 may be equal to or greater than the electrical resistivity of the second electrode 132. According to this, in the semiconductor apparatus, the influence of the second electrode on the resistance value of the resistor can be reduced.

In a cross-sectional view perpendicular to the second main surface 110B of the semiconductor substrate 110 and through the center of the first region 161 of the resistance control layer 160, a width W1 of the first region 161 in a direction parallel to the second main surface 110B may be larger than a thickness T1 of the first region 161 in a direction perpendicular to the second main surface 110B. According to this, it is possible to suppress the occurrence of defects in the resistance control layer when providing the first region. Further, the stability of the shape of the first region can be improved, and the electrical resistivity of the first region in the thickness direction can be made uniform. That is, it is possible to suppress a change in resistance value of the second resistor.

The first region 161 of the resistance control layer 160 may be in a circular shape when the second main surface 110B of the semiconductor substrate 110 is viewed in plan. According to this, defects such as dielectric breakdown caused by electric field concentration and damage caused by stress concentration can be suppressed.

The second region 162 of the resistance control layer 160 may comprise an insulator. According to this, it is possible to suppress conduction in the second region between the semiconductor substrate and the second electrode. That is, the influence of the electrical resistivity and the dimension of the first region on the resistance value of the second resistor can be increased.

The second region 362 of the resistance control layer 360 may comprise silicon oxide. According to this, when the semiconductor substrate comprises a silicon substrate, the second region can be formed by thermal oxidation of the semiconductor substrate. That is, the manufacturing process of the semiconductor apparatus can be simplified to reduce the manufacturing cost.

The first region 161 and the second region 162 of the resistance control layer 160 may comprise a semiconductor. According to this, the first region and the second region can be provided by reducing or increasing the resistance of a part of the semiconductor. At this time, the resistance control layer can be provided so that the first region and the second region have the same thickness. Since the change in dimension of the first region can be suppressed, the change in resistance value of the second resistor can be suppressed.

Further, it is possible to suppress the occurrence of defects such as separation between the first region and the second region.

On the first main surface 510A side of the semiconductor substrate 510, a trench structure 511 including at least one trench portion 510C can be formed, and along the trench structure 511, a dielectric layer 520 and a first electrode 531 may be formed. According to this, in the semiconductor apparatus, the electrostatic capacitance of the capacitor can be increased.

The semiconductor apparatus 100 may be connected in parallel between the drain and source or between the collector and emitter of the transistor. According to this, the semiconductor apparatus can be used as a snubber circuit. Even if the dimension of the semiconductor apparatus is limited, the semiconductor apparatus can be designed as a semiconductor circuit having a suitable electrostatic capacitance and resistance value as a snubber circuit.

As described above, according to one aspect of the present invention, a semiconductor apparatus capable of improving the degree of freedom in design of a circuit can be provided.

The embodiments described above are intended to facilitate understanding of the present invention, and are not intended to interpret the present invention in a limited way. The present invention may be changed/improved without departing from the spirit thereof, and the present invention also includes equivalents thereof. That is, those in which a person skilled in the art appropriately changes the design of each embodiment are included in the scope of the present invention as long as they have the features of the present invention. For example, the elements included in each embodiment and their arrangement, material, condition, shape, size, and the like are not limited to those illustrated, and can be changed appropriately. Further, the elements included in each embodiment can be combined as far as technically possible, and a combination of these elements is also included in the scope of the present invention as long as it includes the features of the present invention.

DESCRIPTION OF REFERENCE SYMBOLS

100: Semiconductor apparatus
C: Capacitor
R, R1: Resistor
110: Semiconductor substrate
110A: First main surface
110B: Second main surface
120: Dielectric layer
131: First electrode
132: Second electrode
160: Resistance control layer
161: Low resistance region (first region)
162: High resistance region (second region)
T1: Thickness of low resistance region
W1: Width of low resistance region

The invention claimed is:

1. A semiconductor apparatus comprising:
a semiconductor substrate having a first main surface and a second main surface;
a first electrode opposing the first main surface of the semiconductor substrate;
a dielectric layer entirely between the semiconductor substrate and the first electrode such that the first electrode does not contact the semiconductor substrate;
a second electrode opposing the second main surface of the semiconductor substrate; and
a resistance control layer between the semiconductor substrate and the second electrode,
wherein the resistance control layer includes a first region that has a first electrical resistivity and that electrically connects the semiconductor substrate and the second electrode, and a second region that has a second electrical resistivity higher than the first electrical resistivity of the first region and is adjacent to the first region, and
wherein the first region of the resistance control layer has one or a combination of a circular shape and an ellipse shape when viewing the second main surface of the semiconductor substrate in a plan view thereof.

2. The semiconductor apparatus according to claim 1, wherein the semiconductor substrate comprises silicon.

3. The semiconductor apparatus according to claim 2, wherein the semiconductor substrate has a third electrical resistivity of $10^{-4}$ Ω·cm to $10^{-2}$ Ω·cm.

4. The semiconductor apparatus according to claim 1, wherein the first electrical resistivity of the first region of the resistance control layer is equal to or greater than a fourth electrical resistivity of the second electrode.

5. The semiconductor apparatus according to claim 1, wherein the first electrical resistivity of the first region of the resistance control layer is equal to or greater than a third electrical resistivity of the semiconductor substrate.

6. The semiconductor apparatus according to claim 1, wherein a third electrical resistivity of the semiconductor substrate is equal to or greater than a fourth electrical resistivity of the second electrode.

7. The semiconductor apparatus according to claim 1, wherein, in a cross-sectional view perpendicular to the second main surface of the semiconductor substrate through a central portion of the first region of the resistance control layer, a width of the first region in a direction parallel to the second main surface is greater than a height of the first region in a direction perpendicular to the second main surface.

8. The semiconductor apparatus according to claim 1, wherein the second region of the resistance control layer is an insulator.

9. The semiconductor apparatus according to claim 1, wherein the second region of the resistance control layer comprises silicon oxide.

10. The semiconductor apparatus according to claim 1, wherein the first region and the second region of the resistance control layer comprise a semiconductor.

11. The semiconductor apparatus according to claim 1, wherein the first region of the resistance control layer comprises a material different from that of the second electrode.

12. The semiconductor apparatus according to claim 1, wherein the first region of the resistance control layer comprises a material the same as that of the semiconductor substrate.

13. The semiconductor apparatus according to claim 1, wherein the second electrode includes a first electrode layer in contact with the second region of the resistance control layer 460 and inside the first region of the resistance control layer, and a second electrode layer that faces the resistance control layer across the first electrode layer.

14. The semiconductor apparatus according to claim 1, further comprising:
a trench structure including at least one trench portion extending into the semiconductor substrate from the first main surface of the semiconductor substrate, and wherein the dielectric layer and the first electrode extend along the trench structure.

15. A circuit comprising the semiconductor apparatus according to claim 1 connected in parallel between a drain and a source or between a collector and an emitter of a transistor.

16. A semiconductor apparatus comprising:
a semiconductor substrate having a first main surface and a second main surface;
a first electrode opposing the first main surface of the semiconductor substrate;
a dielectric layer between the semiconductor substrate and the first electrode;
a second electrode opposing the second main surface of the semiconductor substrate; and
a resistance control layer between the semiconductor substrate and the second electrode,
wherein the resistance control layer includes a first region that has a first electrical resistivity and that electrically connects the semiconductor substrate and the second electrode, and a second region that has a second electrical resistivity higher than the first electrical resistivity of the first region and is adjacent to the first region, and
wherein the first region of the resistance control layer has a circular shape when viewing the second main surface of the semiconductor substrate in a plan view thereof.

* * * * *